(12) United States Patent
Baburske et al.

(10) Patent No.: US 9,899,504 B2
(45) Date of Patent: Feb. 20, 2018

(54) POWER SEMICONDUCTOR TRANSISTOR HAVING INCREASED BIPOLAR AMPLIFICATION

(71) Applicant: Infineon Technologies AG, Neubiberg (DE)

(72) Inventors: Roman Baburske, Otterfing (DE); Johannes Georg Laven, Taufkirchen (DE); Hans-Joachim Schulze, Taufkirchen (DE); Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/359,259

(22) Filed: Nov. 22, 2016

(65) Prior Publication Data

US 2017/0148904 A1    May 25, 2017

(30) Foreign Application Priority Data

Nov. 23, 2015 (DE) .................. 10 2015 120 210

(51) Int. Cl.
*H01L 29/66* (2006.01)
*H01L 29/739* (2006.01)
(Continued)

(52) U.S. Cl.
CPC ...... *H01L 29/7397* (2013.01); *H01L 27/0664* (2013.01); *H01L 29/083* (2013.01);
(Continued)

(58) Field of Classification Search
CPC ............... H01L 29/0804; H01L 29/083; H01L 29/1095; H01L 29/7397; H01L 29/866; H01L 27/0664
See application file for complete search history.

(56) References Cited

U.S. PATENT DOCUMENTS 9,257,543 B2    2/2016  Takahashi
2012/0181575 A1*  7/2012  Pfirsch ............... H01L 29/0834
                                                         257/139
(Continued)

FOREIGN PATENT DOCUMENTS

DE        102006050338 A1    4/2008
DE        102014223793 A1    5/2015

*Primary Examiner* — Trung Q Dang
(74) *Attorney, Agent, or Firm* — Murphy, Bilak & Homiller, PLLC

(57) ABSTRACT

A transistor includes first and second load terminals and a semiconductor body coupled to both terminals. The semiconductor body includes: a drift region having dopants of a first conductivity type; a transistor section for conducting a forward load current and having a control head coupling the first load terminal to a first side of the drift region; and a diode section for conducting a reverse load current. A diode port couples the second load terminal to a second side of the drift region and includes: a first emitter electrically connected to the second load terminal and having dopants of the first conductivity type for injecting majority charge carriers into the drift region; and a second emitter having dopants of a second conductivity type for injecting minority charge carriers into the drift region. A pn-junction transition between the first and second emitters has a breakdown voltage of less than 10 V.

19 Claims, 12 Drawing Sheets

(51) Int. Cl.
*H01L 27/06* (2006.01)
*H01L 29/08* (2006.01)
*H01L 29/10* (2006.01)
*H01L 29/866* (2006.01)

(52) U.S. Cl.
CPC ...... *H01L 29/0804* (2013.01); *H01L 29/0834* (2013.01); *H01L 29/1095* (2013.01); *H01L 29/866* (2013.01)

(56) References Cited

U.S. PATENT DOCUMENTS

| | | | |
|---|---|---|---|
| 2014/0231867 A1* | 8/2014 | Yamashita | H01L 29/872 257/140 |
| 2014/0334212 A1* | 11/2014 | Hashimoto | H01L 27/0727 363/131 |
| 2015/0262999 A1 | 9/2015 | Ogura | |
| 2017/0098700 A1* | 4/2017 | Yamashita | H01L 29/407 |

* cited by examiner

POWER SEMICONDUCTOR TRANSISTOR HAVING INCREASED BIPOLAR AMPLIFICATION

TECHNICAL FIELD

This specification refers to embodiments of a power semiconductor transistor. In particular, this specification refers to embodiments of power semiconductor transistor having means that allow for an increased charge carrier injection during an overload state.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

Some of such power semiconductor devices, e.g., power semiconductor transistors, are capable of conducting a load current in both a forward direction and a reverse direction, such as an Reverse Conducting IGBT (RC-IGBT).

A power semiconductor transistor is usually designed to continuously operate under nominal conditions, according to which, e.g., a load current does normally not exceed a nominal value for more than a predetermined time period.

Occasionally, a power semiconductor transistor may nevertheless become subjected to an overload current that is significantly higher than a nominal load current. During such overload state, the power semiconductor transistor is usually not switched; rather, an eventual switching operation is deferred until the overload current has dropped down to a certain value.

Even though the power semiconductor transistor may not be designed to continuously operate in the overload state, it may be required that the power semiconductor transistor can withstand the overload current for some period of time without suffering any damages.

SUMMARY

According to an embodiment, a power semiconductor transistor comprises a first load terminal, a second load terminal and a semiconductor body coupled to the first load terminal and the second load terminal, wherein the semiconductor body includes: a drift region having dopants of a first conductivity type; a transistor section configured to conduct a forward load current, the transistor section having a control head that couples the first load terminal to a first side of the drift region; and a diode section configured to conduct a reverse load current, wherein the diode section has a diode port that couples the second load terminal to a second side of the drift region, wherein the diode port includes: a first emitter having dopants of the first conductivity type and being configured to inject majority charge carriers into the drift region, the first emitter being electrically connected to the second load terminal; and a second emitter having dopants of a second conductivity type and being configured to inject minority charge carriers into the drift region, wherein the first emitter is arranged in contact with the second emitter, and wherein a pn-junction formed by transition between the first emitter and the second emitter has a breakdown voltage of less than 10 V. Each of the first emitter and the second emitter has a dopant concentration of at least $5e18$ $cm^{-3}$.

According to a further embodiment, a power semiconductor transistor comprises a first load terminal, a second load terminal and a semiconductor body coupled to the first load terminal and the second load terminal, the semiconductor body including: a drift region having dopants of a first conductivity type; a plurality of active cells configured to implement both a transistor operation for conducting a forward load current and a diode operation for conducting a reverse load current, each active cell comprising a control head and an interface region, the control head coupling the first load terminal to a first side of the drift region, and the interface region coupling the second load terminal to a second side of the drift region; wherein the interface region includes: a first emitter having dopants of the first conductivity type and being configured to inject majority charge carriers into the drift region for diode operation; a second emitter having dopants of a second conductivity type and being configured to inject minority charge carriers into the drift region; and a third emitter arranged separately from the second emitter and electrically connected to the second load terminal, the third emitter having dopants of the second conductivity type and being configured to inject minority charge carriers into the drift region for transistor operation, wherein the dopant concentration of the second emitter is greater than the dopant concentration of the third emitter, Each of the first emitter, the second emitter and the third emitter is electrically connected to the second load terminal. The semiconductor body further comprises a field stop region having dopants of the first conductivity type at a greater dopant concentration than the drift region, wherein the field stop region couples each of the first emitter, the second emitter and the third emitter to the drift region.

According to a yet further embodiment, a power semiconductor transistor comprises a first load terminal, a second load terminal and a semiconductor body coupled to the first load terminal and the second load terminal, the semiconductor body including: a drift region having dopants of a first conductivity type; a plurality of active cells configured to implement both a transistor operation for conducting a forward load current and a diode operation for conducting a reverse load current, each active cell comprising a control head and an interface region, the control head coupling the first load terminal to a first side of the drift region, and the interface region coupling the second load terminal to a second side of the drift region; wherein the interface region includes: a first emitter having dopants of the first conductivity type and being configured to inject majority charge carriers into the drift region for diode operation; a second emitter having dopants of a second conductivity type and being configured to inject minority charge carriers into the drift region; and a third emitter arranged separately from the second emitter, the third emitter having dopants of the second conductivity type and being configured to inject minority charge carriers into the drift region for transistor operation, wherein each of the first emitter, the second emitter and the third emitter is electrically connected to the second load terminal. A dopant concentration of the second emitter is greater than a dopant concentration of the third emitter. The third emitter isolates the second emitter from the first emitter.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
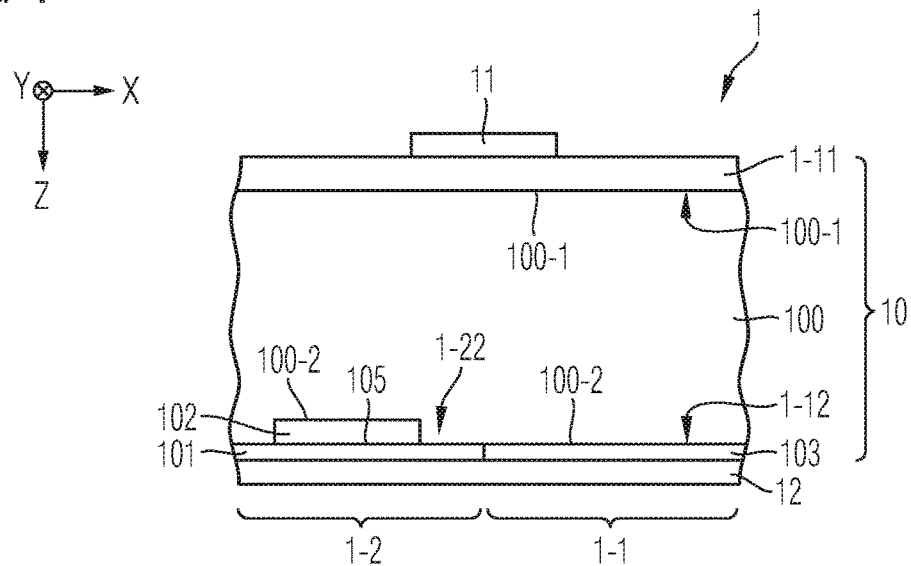
FIG. 1 schematically illustrates a section of a vertical cross-section of a power semiconductor transistor in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor body. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone, such as a semiconductor region within a trench. Thus, e.g., a statement saying that a specific semiconductor region has a certain dopant concentration that is higher or lower as compared to a dopant concentration of another semiconductor region may indicate that the respective mean dopant concentrations of the semiconductor regions differ from each other.

In the context of the present specification. the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device: e.g., a transition between two elements being in contact with each other may not include a further intermediate element or the like.

Specific embodiments described in this specification pertain to, without being limited thereto, a power semiconductor transistor that may be used within a power converter or a power supply. For example, the power semiconductor transistor may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module.

The term "power semiconductor transistor" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above.

FIG. 1 schematically illustrates a section of a vertical cross-section of a power semiconductor transistor 1, in the following also simply referred to as "transistor", in accordance with one or more embodiments. The illustrated vertical cross-section may be parallel to a plane defined by a vertical direction Z and a first lateral direction X arranged perpendicular thereto.

The transistor 1 includes a semiconductor body 10 coupled to a first load terminal 11 and to a second load terminal 12. In an embodiment, the first load terminal 11 is arranged on a frontside of the semiconductor body 10 and the second load terminal 12 is arranged on a backside of a semiconductor body 10. For example, the first load terminal 11 comprises a frontside metallization and the second load terminal 12 comprises a backside metallization.

The transistor 1 may be configured to conduct a load current between the first load terminal 11 and the second load terminal 12 in a forward direction, e.g., opposite to the vertical direction Z, and in a reverse direction opposite to the forward direction, e.g., in the vertical direction Z. To this end, the transistor 1 may comprise a transistor section 1-1 configured to conduct the forward load current at least partially. Further, the transistor 1 may comprise a diode section 1-2 that is configured to conduct the reverse load current at least partially. For example, in proximity to the second load terminal 12, e.g., in a backside region of the transistor 1, the diode section 1-2 may be arranged laterally adjacent to the transistor section 1-1, as schematically illustrated in FIG. 1.

The semiconductor body 10 of a transistor 1 may include a drift region 100 that has dopants of a first conductivity type. For example, the drift region is a weakly n-doped region.

The transistor 1 may further have a control head 1-11 that couples the first load terminal 11 to a first side 100-1 of the drift region 100. The control head 1-11 may be arranged in front side region of the transistor 1. For example, the control head 1-11 may form a part of each of said transistor section 1-1 that is configured to conduct the forward load current at least partially and of said diode section 1-2 that is configured to conduct the reverse load current at least partially. The control head 1-11 that couples the first load terminal 11 to the first side 100-1 of the drift region 100 may has a conventional configuration having, e.g., a source region, a body region (also referred to as channel region) and an insulated gate, an exemplary embodiment of which will be explained in more detail with respect to FIG. 4.

The diode section 1-2 that is configured to conduct the reverse load current at least partially may comprise a diode port 1-22 that couples a second load terminal 12 to a second side 100-2 of the drift region 100. The diode port 1-22 may include a first emitter 101 that has dopants of the first conductivity type and that is configured to inject majority charge carriers into the drift region, wherein the first emitter 101 can be electrically connected to the second load terminal 12. For example, the first emitter is a highly doped n-region ($n^+$-region).

As illustrated in FIG. 1, the first side 100-1 of the drift region 100 may face towards the first load terminal 11, e.g., towards a frontside of the transistor 1, and the second side 100-2 of the drift region 100 may face towards the second load terminal 12, e.g., towards a backside of the transistor 1.

The transistor section 1-1 may further comprise a drain port 1-12 that also couples the second load terminal 12 to the second side 100-2 of the drift region 100. This drain port 1-12 may include a third emitter 103 that may be arranged laterally adjacent to the first emitter 101 and that is also electrically connected to the second load terminal 12. The third emitter 103 may have dopants of the second conductivity type and can be configured to inject minority charge carriers into the drift region 100.

In an embodiment, the first emitter 101, the second emitter 102 and the third emitter 103 form a backside emitter of the transistor 1, For example, the diode port 1-22 forms a part of a cathode of the diode section 1-2. A part of an anode of the diode section 1-2 may be included within the control head 1-11.

In accordance with the embodiment schematically illustrated in FIG. 1, the diode port 1-22 may further include a second emitter 102 that has dopants of the second conductivity type and that is configured to inject minority charge carriers into the drift region 100. The first emitter 101 can be arranged in contact with the second emitter 102. For example, due to the contact, a pn-junction 105 is formed by a transition between the first emitter 101 and the second emitter 102. In accordance with an embodiment, a breakdown voltage of said pn-junction 105 amounts to less than 10 V. The breakdown voltage of the pn-junction 105 can be even lower than 10 V, for example, lower than 8 V, lower than 7 V, or even lower than 5 V. For example, the direction of the breakdown voltage may point from the second load terminal 12 to the first load terminal 11, e.g., against the vertical direction Z, e.g., if the second emitter 102 is p-doped and the first emitter 101 is n-doped.

The second emitter 102 may be configured to carry the load current, e.g., at least one of the reverse load current and the forward load current, at least partially. Thus, the second emitter 102 may form a load current carrying element of the transistor 1. In other words, a path of the load current e.g., at least one of the path of the reverse load current and the path of the forward load current, may traverse through the second emitter 102.

Further, as schematically illustrated in FIG. 1, the pn-junction 105 may be isolated from the second load terminal 12. For example, to this end, the first emitter 101 may be arranged so as to isolate the second emitter 102 from the second load terminal 12. Further, the second emitter 102 may be spatially isolated from the third emitter 103 by means of at least one of the drift region 100 and the first emitter 101.

In accordance with an embodiment, the voltage over the pn-junction 105 may depend on a magnitude of the load current conducted by the transistor 1. For example, if the load current exceeds a nominal threshold value, the voltage over the pn-junction 105 may reach or even exceed the breakdown voltage of the pn-junction 105, which may result in an increased injection of minority charge carriers into the drift region 100. Thus, in accordance with an embodiment, the first emitter 101 and the second emitter 102 are configured to be operated as a Zener diode. To this end, the dopant concentration of each of the first emitter 101 and the second emitter 102 may amount to at least 5e18 $cm^{-3}$, e.g., in proximity of the pn-junction 105. In other words, the second emitter 102 can be electrically floating and be arranged in contact with the first emitter and has a dopant concentration sufficiently high such that the Zener effect may be used. In an embodiment, each of the first emitter 101 and the second emitter 102 may has a maximum dopant concentration of at least 5e18 $cm^{-3}$, e.g., in proximity of the pn-junction 105.

The semiconductor body 10 may also include a field stop layer (not illustrated in FIG. 1) that may cover each of the first emitter 101, the second emitter 102 and the third emitter 103. For example, the field stop layer may comprise dopants of the first conductivity type at a higher dopant concentration as compared to the drift region 100. Thus, it shall be understood that the second side 100-2 of the drift region 100 may be coupled to the second load terminal 12 by means of said field stop layer and by one or more of the first emitter 101, the second emitter 102 and the third emitter 103. This optional aspect will be elucidated in more detail with respect to FIG. 4.

Figure 2:
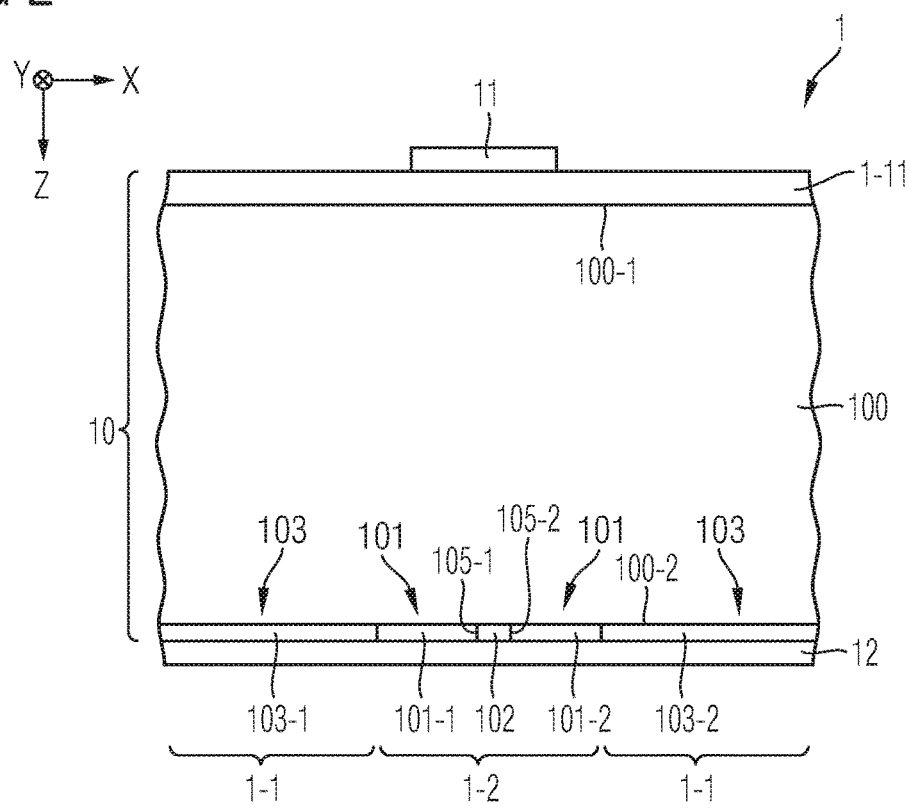
FIG. 2 schematically illustrates a section of a vertical cross-section of a power semiconductor transistor in accordance with one or more embodiments.

FIG. 2 schematically illustrates a section of a vertical cross-section of the power semiconductor transistor 1 in accordance with one or more further embodiments. What has been stated above regarding the embodiment in accordance with FIG. 1 may equally apply to the embodiment in accordance with FIG. 2, if not stated otherwise.

For example, the transistor 1 may comprise, in a conventional manner, an active region and a non-active edge region, also referred to as "junction termination region", surrounding the active region. For example, the active region is configured to conduct the load current in each of the forward direction and the reverse direction, and, in accordance with an embodiment, the edge region surrounding the active region is not configured to conduct said load current. Since the differentiation between the active region and the edge region is as such common to the skilled person, the drawings do not separately show these elements of the transistor 1.

The active region may comprise a plurality of active cells, wherein each active cell may comprise at least one of said transistor section 1-1 and at least one of said diode section 1-2. Thus, each active cell may be configured to implement both a transistor operation for conducting the forward load current and a diode operation for conducting the reverse load current. Each active cell may further comprise at least a control head 1-11 coupled to the first side 100-1 of the drift region 100 and an interface region including the first emitter 101, the second emitter 102 and the third emitter 103 and coupling the second load terminal to the second side 100-2 of the drift region 100.

For example, the number of active cells included in the active region of the transistor 1 amounts to at least 100, to at least 1000 or to even more than 10000. Further, each of these active cells can has a substantially identical configuration. Thus, it shall be understood that the number of second emitters 102 included in the active region of the transistor 1 may be identical to the number of active cells included in the active region of the transistor 1.

For example, the first emitter 101 of the interface region has dopants of the first conductivity type and is configured to inject majority charge carriers into the drift region 100 for diode operation. The first emitter 101 may be electrically connected to the second load terminal 12. Further, the first emitter 101 may be separated into two or more first subsections 101-1, 101-2 that may be aligned, e.g., to the backside transistor section 1-1 and the diode section (1-2).

The second emitter 102 may have the dopants of the second conductivity type and can be configured to inject minority charge carriers into the drift region 100, e.g., if the load current, e.g. at least one of the forward load current and the reverse load current, exceeds said nominal threshold value.

Further, the third emitter 103 may be arranged separately from the second emitter 102 and may be electrically connected to the second load terminal 12. The third emitter 103 may have dopants of the second conductivity type and can be configured to inject minority charge carriers into the drift region 100 for transistor operation. Optionally, the third emitter 103 may be separated into two or more third subsections 103-1, 103-2. It shall be understood that, in an embodiment, the third emitter 103 or, respectively, the third subsections 103-1, 103-2, may comprise an inhomogeneous dopant distribution along the first lateral direction X, e.g., for taking into account the transition between the action region and the edge region mentioned above.

In an embodiment, the dopant concentration of the second emitter 102 is greater than the dopant concentration of the third emitter 103. For example, the dopant concentration of the second emitter 102 is at least ten times greater than the dopant concentration of the third emitter 103.

In accordance with the embodiment schematically illustrated in FIG. 2 and in contrast to the embodiment of FIG. 1, the second emitter 102 may be electrically connected to the second load terminal 12 and be arranged adjacent to two first subsections 101-1 and 101-2 of the first emitter 101. Thus, along the first lateral direction X, a transition between the first emitter 101 and the second emitter 102 may comprise two pn-junctions 105-1 and 105-2. Due to the lateral neighborhood relationship between the first emitter 101 and the second emitter 102, each of the pn-junctions 105-1 and 105-2 may substantially extend in parallel to the vertical direction Z.

Further, each of the first subsections 101-1 and 101-2 may be laterally neighbored by a respective third subsection 103-1, 103-2, as illustrated in FIG. 2. Each of the first emitter 101, the second emitter 102 and the third emitter 103 may has the same total extension along the vertical direction Z.

Figure 3:
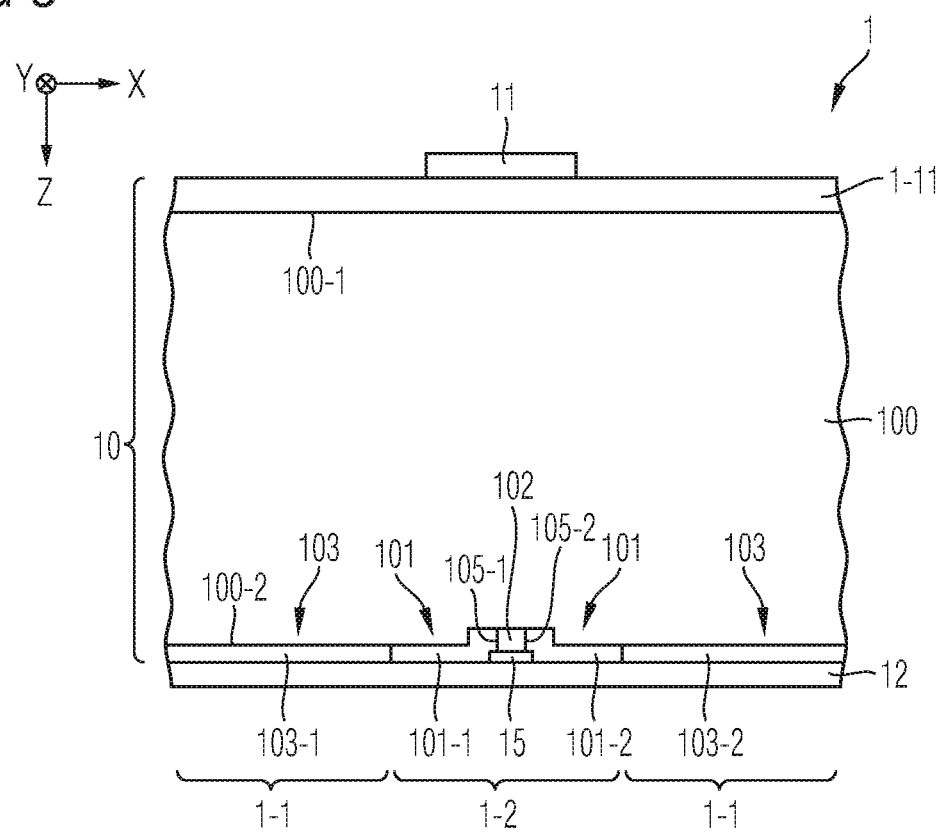
FIG. 3 schematically illustrates a section of a vertical cross-section of a power semiconductor transistor in accordance with one or more embodiments.

In accordance with a further embodiment, an example of which is schematically illustrated in FIG. 3, the pn-junctions 105-1 and 105-2 formed by transitions between the second emitter 102 and the first emitter 101 may be electrically insulated from the second load terminal 12 by means of an insulator 15. For example, the insulator 15 may be arranged between the second emitter 102 and the second load terminal 12 such that none of the pn-junctions 105-1 and 105-2 that are formed by transitions between the second emitter 102 and the first emitter 101 are in contact with the second load terminal 12, but isolated therefrom.

For example, in accordance with each of the embodiments schematically illustrated in FIG. 1 to FIG. 3, each active cell of the transistor 1 comprises said second emitter 102 that is doped with dopants of the second conductivity type and that may be configured to inject minority charge carriers into the drift region 100 if a magnitude of the load current, e.g., at least one of the forward load current and the reverse load current, exceeds a nominal threshold value. For example, the second emitter 102 is not necessarily arranged in the edge region of the transistor 1, but rather only in the active cells of the transistor 1. For example, due to presence of the second emitter 102 in the active cells of the transistor 1, the transistor 1 may has an increased bipolar amplification during an overload state, e.g., in the event that the load current, e.g., at least one of the forward load current and the reverse load current, exceeds the nominal threshold value. Further, in accordance with an embodiment, the second emitter 102 may be configured to not inject minority charge carriers into the drift region 100, if the load current, e.g., at least one of the forward load current and the reverse load current, is below said nominal threshold value.

In an embodiment, the nominal threshold value amounts to the nominal load current, e.g., the nominal forward load current or the nominal reverse load current, for which the power semiconductor transistor 1 is designed, multiplied with a certain factor. For example, the factor can be chosen in dependence of the application and can amount to, e.g., 1.2, 1.5, 3.0 or 4.0, to name a few examples. Thus, the nominal threshold value may correspond to 1.2, 1.5, 3.0 or to 4.0 times of the nominal load current for which the power semiconductor transistor 1 is designed.

In accordance with an embodiment, the structure exemplary and schematically illustrated in one of FIG. 1 to FIG.

3 may be employed for forming a Reverse Conducting IGBT (RC-IGBT). An exemplary embodiment of such RC-IGBT is schematically illustrated in FIG. 4, to which it will now be referred.

Figure 4:
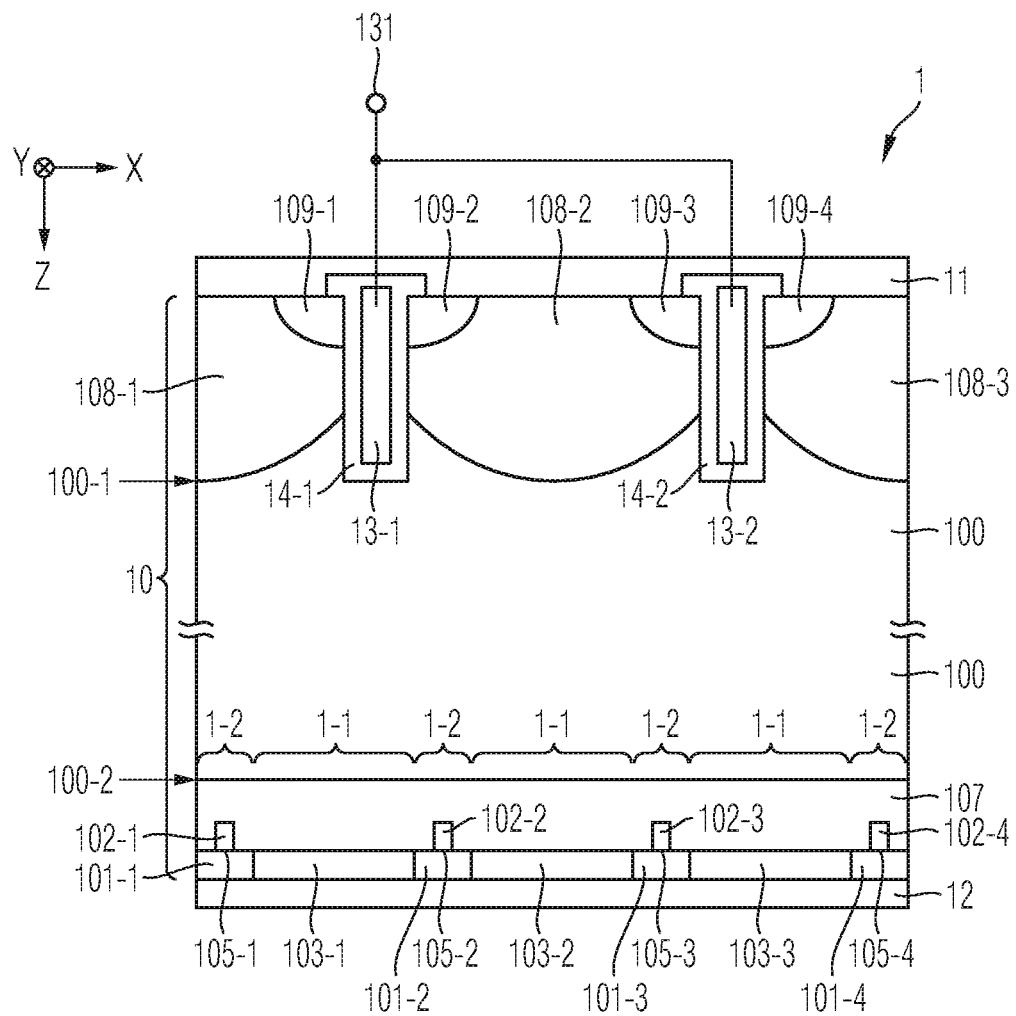
FIG. 4 schematically illustrates a section of a vertical cross-section of a reverse conducting IGBT in accordance with one or more embodiments.

FIG. 4 schematically illustrates a section of a vertical cross-section of an RC-IGBT 1 in accordance with one or more embodiments. The exemplary embodiment of FIG. 4 employs the structure as has been previously explained with respect to FIG. 1. However, it shall be understood that the interface region formed by the emitters 101 to 103 could also has configuration as schematically illustrated in FIG. 2 or, respectively, as illustrated in FIG. 3.

On a frontside of the RC-IGBT 1, there may be arranged a plurality of source regions 109-1 to 109-4 electrically connected to the first load terminal 11, wherein these source regions 109-1 to 109-4 may be semiconductor source regions that comprise dopants of the first conductivity type at a higher dopant concentration as compared to the drift region 100. For example, each of the source regions 109-1 to 109-4 may be a highly doped n-region ($n^+$-region). In accordance with another embodiment, the source region 109-1 to 109-4 may be metal source regions.

Further, the RC-IGBT 1 may comprise a plurality of body regions 108-1 to 108-3 that comprise dopants of the second conductivity type and that isolate the source regions 109-1 to 109-4 from the semiconductor drift region 100.

Further, the RC-IGBT 1 may comprise a plurality of trench gate electrodes 13-1 and 13-2 that are electrically insulated from the semiconductor body 10 by means of a respective trench insulator 14-1 and 14-2. For example, the trench gate electrodes 13-1 and 13-2 are further electrically insulated from the first load terminal 11. In another embodiment, at least one of the electrodes 13-1, 13-2 may be used as a field plate, e.g., by electrically connecting the electrode to the first load terminal 11.

In an embodiment, the control head 1-11 mentioned above with respect to FIG. 1 to FIG. 3 may be formed by at least one of the trench gate electrodes 13-1, 13-2, at least one of the trench insulators 14-1, 14-2, at least one of the source regions 109-1 to 109-4 and at least one of the body regions 108-1 to 108-3.

The trench gate electrodes 13-1 and 13-2 can be electrically connected to each other and coupled to a control terminal 131 for receiving a control signal. For example, the RC-IGBT 1 is configured to be set in one of the blocking state and a conducting state in dependence of the control signal. The control signal can be provided, e.g., by applying a voltage between the first load terminal 11 and the control terminal 131. For example, when being in the blocking state, a depletion region formed between the body regions 108-1 to 108-3 and the drift region 100 may be configured to block a forward voltage applied between the first load terminal 11 and the second load terminal 12. For example, when being in the conducting state, an inversion channel may be induced within the body regions 108-1 to 108-3 adjacent to the trench insulators 14-1 and 14-2 so as to allow for conduction of the forward load current.

On the backside, the RC-IGBT 1 may comprise said interface region comprising the first emitter 101, the second emitter 102 and the third emitter 103. As illustrated in FIG. 4, the first emitter 101 may comprise first (emitter) subsections 101-1 to 101-4, the second emitter 102 may comprise second (emitter) subsections 102-1 to 102-4, and third emitter 103 may comprise third (emitter) subsections 103-1 to 103-3.

Further, the RC-IGBT 1 may comprise a field stop layer 107 that has already been mentioned above with respect to FIG. 1. Accordingly, the field stop layer 107 may comprise dopants of the first conductivity type, e.g., at a higher dopant concentration as compared to the drift region 100. For example, the field stop region 107 is a highly doped n-region ($n^+$-region). The field stop region 107 may cover each of the first emitter 101, the second emitter 102 and the third emitter 103.

Each transistor section 1-1 may comprise at least one of the third emitter subsections 103-1 to 103-3, and each diode section 1-2 may comprise both at least one of the first emitter subsections 101-1 to 101-4 and at least one of said second emitter subsections 102-1 to 102-4. The first subsections 101-1 to 101-4 of the first emitter 101 may also be referred to as "n-shorts" in some embodiments.

In accordance with the embodiment of the RC-IGBT 1 schematically illustrated in FIG. 4, the second emitter 102, i.e., its second subsections 102-1 to 102-4 are electrically insulated from the second load terminal 12 by means of a respective one of the first subsections 101-1 to 101-4 of the first emitter 101. In accordance with an embodiment, each emitter pair formed by one of the first subsections of the first emitter 101 and one of the second subsections of the second emitter 102 is configured to be operated as a Zener diode, as has been explained with respect to FIG. 1 above.

It shall be understood that, in the event that each of the left border and the right border of the section depicted in FIG. 4 forms an axis of symmetry, FIG. 4 schematically illustrates a variant of the arrangement of the second subsections 102-1 to 102-4 and the n-shorts 101-1 to 101-4, according to which the number of n-shorts arranged in between a lateral section defined by the two adjacent trenches 13-1 and 13-2 may be different as compared to the number of n-shorts arranged external of said lateral section. E.g., such arrangement can be appropriate if the density of inversion channels formed at the front side is inhomogeneous.

Further, it shall be understood that the first emitters (e.g., the n-shorts) 101-1 to 101-4 may has lateral extensions different from each other and that the number of second emitters 102-1 to 102-4 may vary accordingly. Further, the second emitters 102-1 to 102-4 may has the shape of a stripe, e.g., due to a total extension along the second lateral direction Y amounting a multitude of the total extension along the first lateral direction X.

With respect to the remaining FIGS. 5 to 13, further optional features of exemplary arrangements of said first emitter 101, said second emitter 102 and said third emitter 103 of an active cell of the transistor 1 will be described; i.e., exemplary embodiments of the interface region comprising the first emitter 101, the second emitter 102 and the third emitter 103 shall be presented in more detail. What has been stated above regarding the remaining features of the embodiments of the transistor 1 that has been explained with respect to FIG. 1 to FIG. 4 may equally apply to the embodiments that will be described in the following, if not stated otherwise.

Even though most of the FIGS. 5 to 13 illustrate the first emitter 101 and the third emitter 103 with identical total extensions along the vertical direction Z, it shall be understood that, in accordance with one or more embodiments, said total extensions may be different from each other. Just referring to FIG. 7 as an example, the total extension of the first emitter 101 along the vertical direction Z may be greater than the total extension of the adjacent third subsections 103-1 and 103-2 along the vertical direction Z, e.g., amounting to at least 120% of the total extensions of the adjacent third subsections 103-1 and 103-2. In accordance with another embodiment, the total extension of the first emitter 101 along the vertical direction Z may be smaller than the total extension of the adjacent third subsections 103-1 and 103-2 along the vertical direction Z, e.g., amounting to less than 80% of the total extensions of the adjacent third subsections 103-1 and 103-2.

For example, in accordance with one or more embodiments presented below, the interface region comprising the first emitter 101, the second emitter 102 and the third emitter 103 may constitute a backside emitter of the transistor 1. Further, the position of the second emitter, its spatial dimensions and its dopant concentration can be chosen such that the second emitter 102 only becomes active, if the load current, e.g., at least one of the forward load current and the reverse load current, exceeds said nominal threshold value. Thus, the second emitter 102 may be configured such that it injects said minority charge carries into the drift region 100 only if the load current, e.g., at least one of the forward load current and the reverse load current, is sufficiently high, e.g., significantly higher than the nominal load current, and that it remains substantially inactive, as long as this condition is not met.

Figure 5:
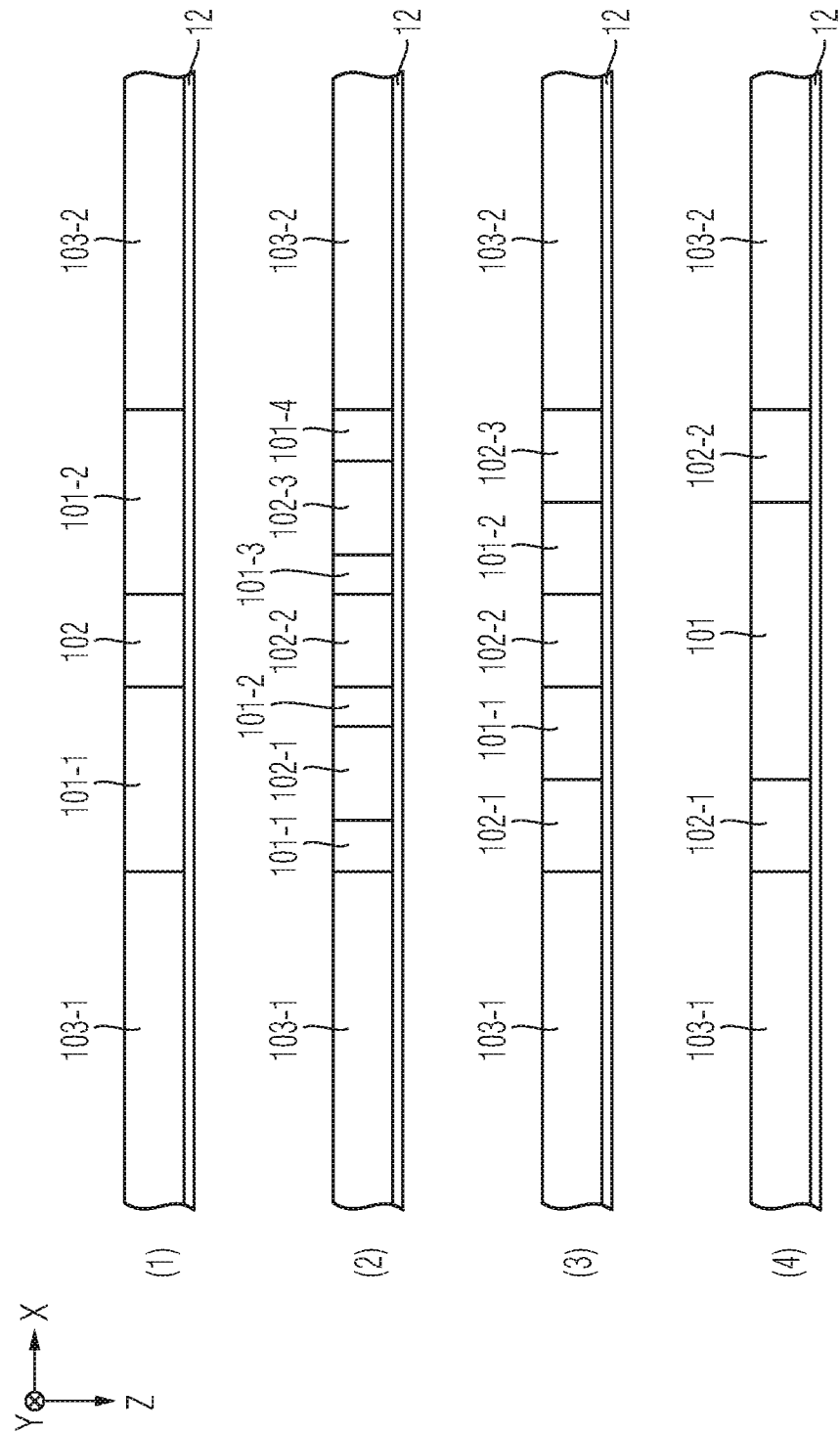
FIGS. 5-11 each schematically illustrate a section of a vertical cross-section of an emitter arrangement of a power semiconductor transistor in accordance with one or more embodiments.

In accordance with the variants (1) to (4) of the interface region schematically illustrated in FIG. 5, each of the first emitter 101, the second emitter 102 and the third emitter 103 may be electrically connected to the second load terminal 12. For example, each of the three emitters 101 to 103 has the same total extension along the vertical direction Z. In variant (1), the second emitter 102 is spatially isolated along the first lateral direction X from third subsections 103-1 and 103-2 of the third emitter 103 by means of first subsections 101-1 and 101-2 of the first emitter 101. The total extension of the second emitter 102 along the first lateral direction X may be significantly smaller than the total extension along the first lateral direction X of the third emitter 103 or, respectively, its third subsections 103-1 and 103-2. In variant (2), the second emitter 102 comprises second subsections 102-1 to 102-3 arranged spatially separated from each other, wherein each second subsection 102-1 to 102-3 is isolated along the first lateral direction X from the third emitter 103 by subsections 101-1 to 101-4 of the first emitter 101. In variant (3), second subsections 102-1 and 102-3 of the second emitter 102 are arranged laterally adjacent to subsections 103-1 and 103-2 of the third emitter 103. Thus, the second emitter may be in contact with the third emitter 103. In variant (4), the first emitter 101 is not interrupted by the second emitter 102 or, respectively, by a second subsection of the second emitter 102. Summarizing, in accordance with the embodiment of the interface region schematically illustrated in FIG. 5, the first emitter 101 may be laterally flanked by the second emitter 102 or, respectively, by second subsections 102-1 to 102-3 of the second emitter 102, Further, in accordance with an embodiment, in each active cell of the transistor 1, the total extension of the second emitter 102 or, respectively, the accumulated total extension of all second subsections of the second emitter 102 along the first lateral direction X amounts to less than 75% of the total extension of the third emitter 103 or, respectively, the accumulated total extension of all third subsections of the third emitter 103 in each active cell. Also, in accordance with an embodiment, in each active cell of the transistor 1, the total extension of the second emitter 102 or, respectively, the accumulated total extension of all second subsections of the second emitter 102 along the first lateral direction X amounts to less than 75% of the total extension of the first emitter 101 or, respectively, the accumulated total extension of all first subsections of the third emitter 100 in each active cell. But, said lateral extension of the second emitter 102 along the first lateral direction X can be even significantly smaller than 75% of the lateral extension of the first emitter 101 or the third emitter 103; for example, the total extension of the second emitter 102 may be within the range of 10% to 50% of the total extension of the third emitter 103 along the first lateral direction X, in accordance with the variants illustrated in FIG. 5. For example, the total extension of the second emitter 102 may also be within the range of 10% to 110% of the total extension of the third emitter 103 along the first lateral direction X, in accordance with the variants illustrated in FIG. 9. Further, in accordance with the embodiments schematically illustrated in FIG. 5, the dopant concentration of the second emitter 102, or respectively, the dopant concentrations present within each of its second subsections, is at least ten times as high the dopant concentration of the third emitter 103. For example, the dopant concentration of the third emitter 103 is within the range of $1e17$ cm$^{-3}$ to $1e18$ cm$^{-3}$, and the dopant concentration of the second emitter 102 is within the range of $1e18$ cm$^{-3}$ to $1e22$ cm$^{-3}$. In accordance with another embodiment, the dopant concentrations may be lower, e.g., the dopant concentration of the third emitter 103 maybe within the range of $1e15$ cm$^{-3}$ to $1e18$ cm$^{-3}$, and the dopant concentration of the second emitter 102 may be within the range of $1e17$ cm$^{-3}$ to $1e22$ cm$^{-3}$.

Figure 6:
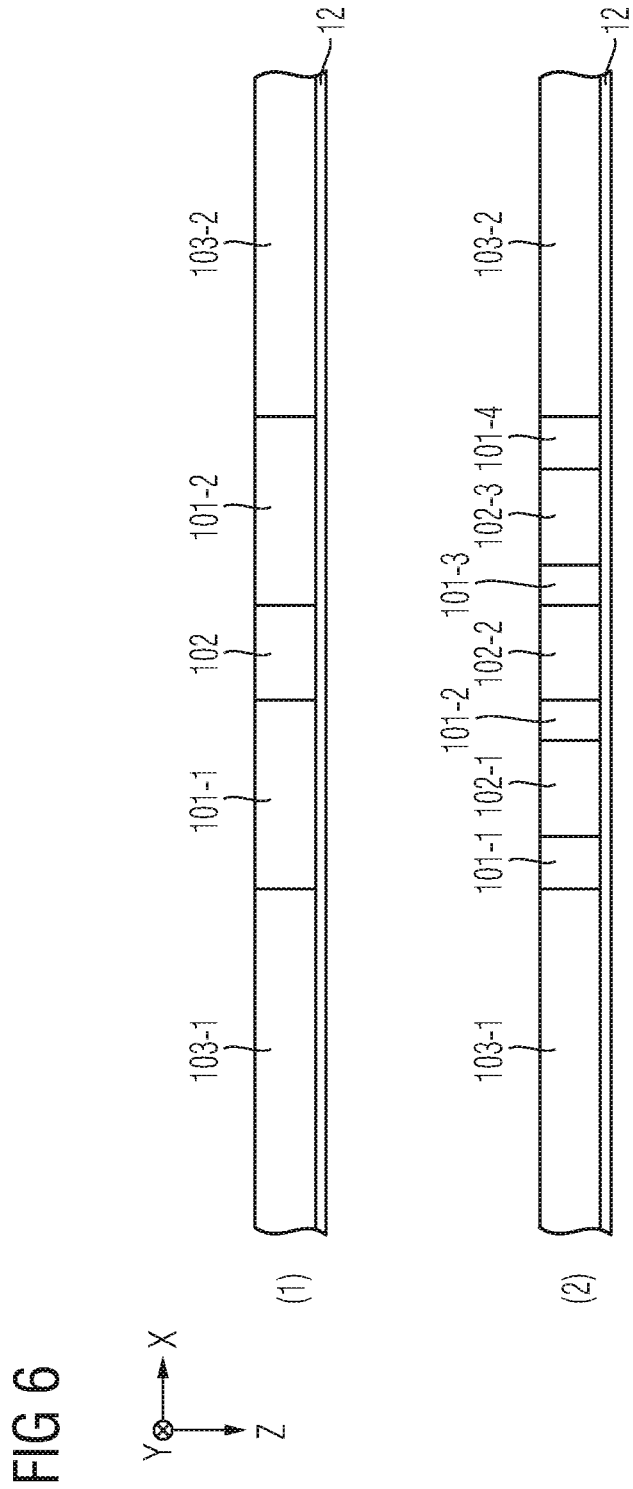

In accordance with variants (1) to (2) of the exemplary embodiment of the interface region schematically illustrated in FIG. 6, the spatial dimensions of the three emitters 101, 102 and 103 can correspond to those that have been explained with respect to the embodiment of FIG. 5, wherein the dopant concentration of the second emitter 102 or, respectively, the dopant concentration of its second subsections 102-1 to 102-3, is substantially equal to the dopant concentration of the third subsections 103-1, 103-2 of the third emitter 103, which may be in the range of, e.g., $2e17$ cm$^{-3}$ to $1e18$ cm$^{-3}$. Thus, in accordance with the embodiment schematically illustrated in FIG. 6, each active cell of the transistor 1 may comprise the third emitter 103 configured to inject the minority charge carriers for a transistor operation of the transistor 1 and the first emitter 101 configured to inject majority charge carriers into the drift region 100 for diode operation, wherein the first emitter 101 may be interrupted by the second emitter 102 or, respectively, by its second subsections 102-1 to 102-3, wherein the second emitter 102 may be configured to inject minority charge carriers into the drift region if the load current conducted by the transistor 1 exceeds said nominal threshold value.

Figure 7:
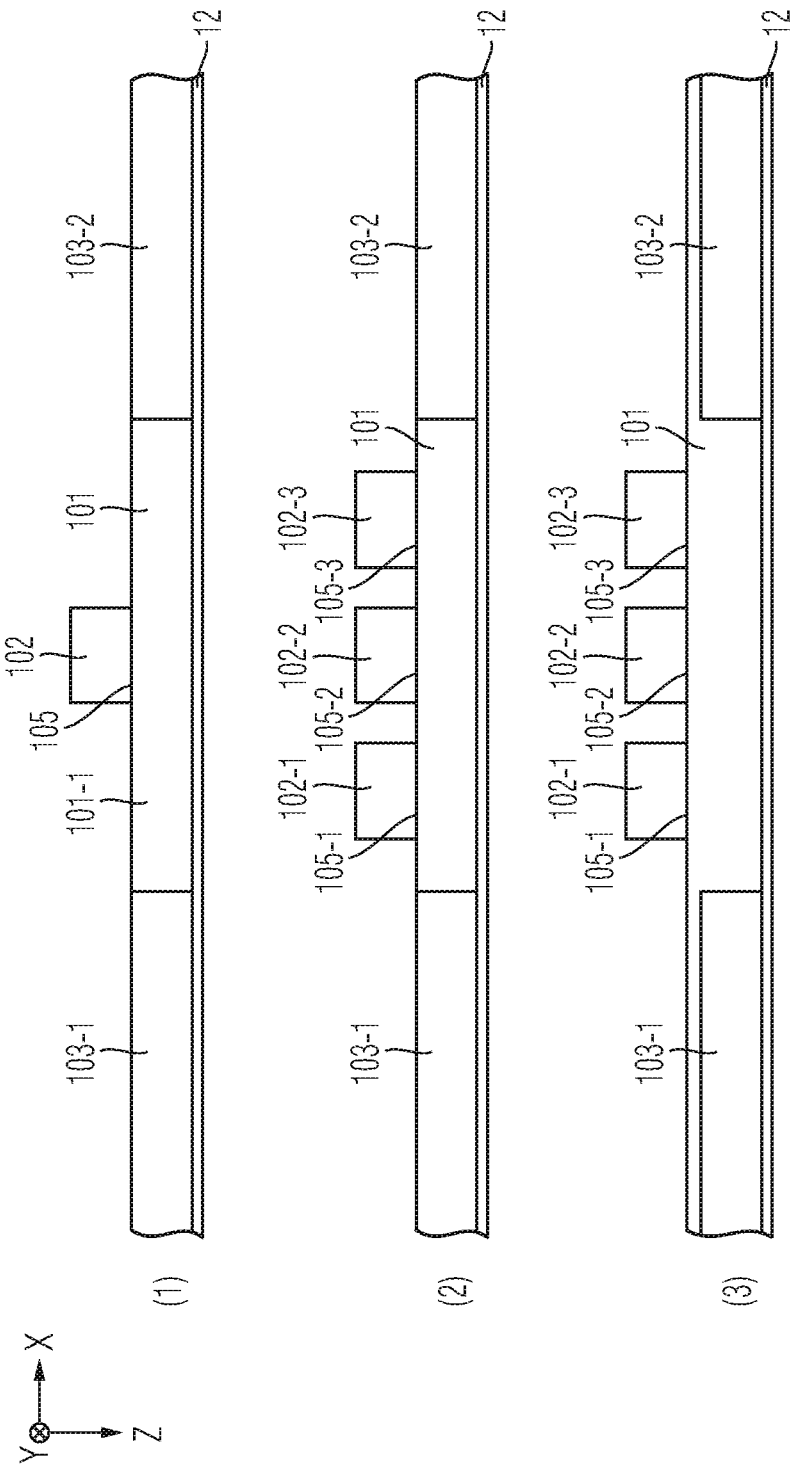

In accordance with variants (1) to (3) of the exemplary embodiment of the interface region schematically illustrated in FIG. 7, the first emitter 101 may isolate the second emitter 102 from each of the third emitter 103 and the second load terminal 12. For example, the second emitter 102 or, respectively, its second subsections 102-1 to 102-3 may be arranged on top of the first emitter 101 in an island structure, For example, the total extension along the first lateral direction X of each of the second subsections 102-1 to 102-3 amounts to no more than 30% of the total extension along the first lateral direction X of the first emitter 101. In accordance with variants (1) to (3) schematically illustrated in FIG. 7, the second emitter 102 is not arranged in a region above the third emitter 103 such that a path starting from one of the third subsections 103-1 and 103-2 in parallel to the vertical direction Z does not traverse the second emitter 102 or a subsection thereof. In other words, in an embodiment, the second emitter 102 (or, respectively, its second subsections) and the third emitter 103 (or, respectively, its third subsections) are arranged such they do not has a common lateral extension range along the first lateral direction X. In variant (1), in each active cell, the first emitter 101 is covered by only one second emitter 102. In variant (2), each first emitter 101 may be covered by more than one second subsection 102-1 to 102-3 of the second emitter 102, wherein these subsections 102-1 to 102-3 may be arranged separately from each other. In accordance with variant (3), the first emitter 101 may cover the third emitter 103. For example, in variant (3), the layer like part of the first emitter 101 between the second subsections 102-1 to 102-3 and the third emitter 103 in the vertical direction Z can be used to ensure or, respectively, support the blocking requirements in the blocking state. For example, said part of the first emitter 101 may be arranged to separate, along the vertical direction Z, the third emitter 103, e.g., its third subsections 103-1 and 103-2, from the drift region 100. As has been explained with respect to FIG. 1, a transition between the second emitter 102 and the first emitter 101 may form a pn-junction 105, wherein the pn-junction 105 may has a breakdown voltage of less than 10 V. For example, the first emitter 101 and the second emitter 102 are configured to be operated as a Zener diode. This may also apply to the pn-junctions 105-1 to 105-3 formed between each of the second subsections 102-1 to 102-3 and the first emitter 101 in accordance with variants (2) and (3).

Figure 8:
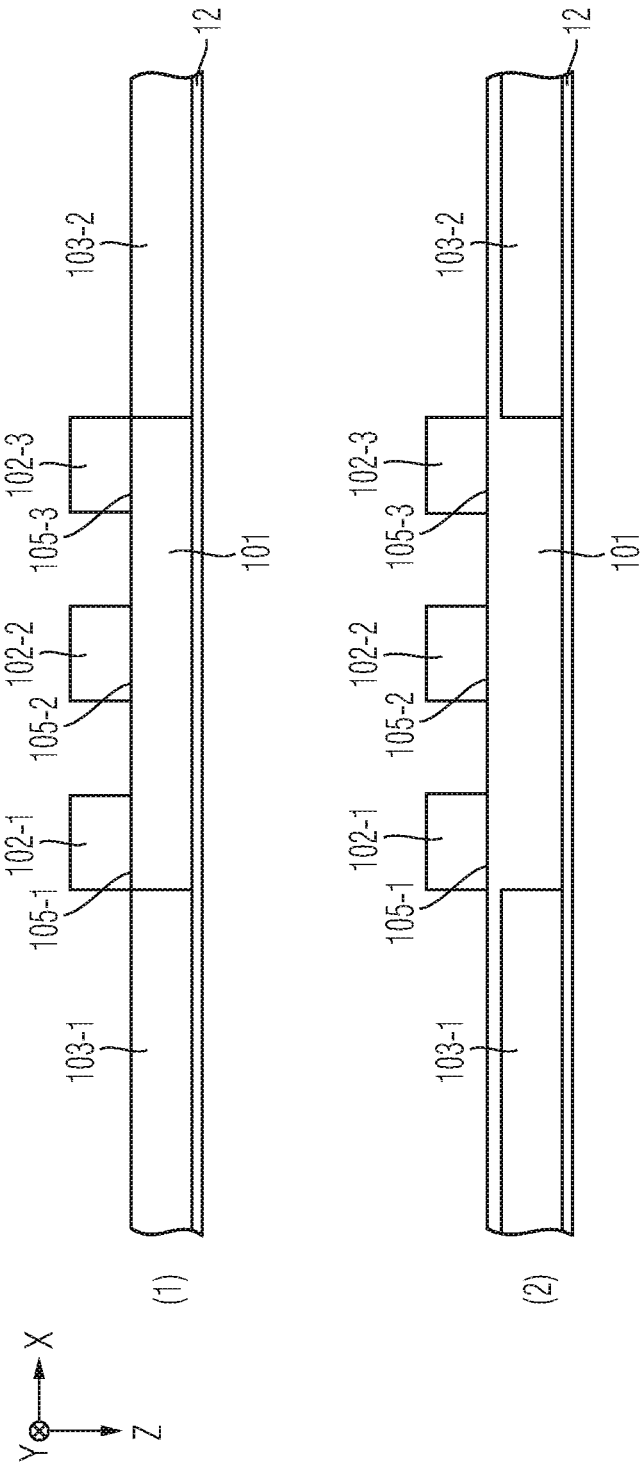

In accordance with variants (1) to (2) of the embodiment of the interface region schematically illustrated in FIG. 8, the second subsections 102-1 to 102-3 of the second emitter 102 may has a small overlap along the first lateral direction X with the third emitter 103. For example, in variant (1), the second subsections 102-1 and 102-3 of the second emitter 102 are in contact with third subsections 103-1 to 103-3 of the third emitter 103. In variant (2), the second subsections 102-1 and 102-3 still has a small overlap along the first lateral direction X with the third emitter 103; however, the second emitter 102 is spatially isolated from the third emitter 103 by means of the first emitter 101 which may at least partially cover the third emitter 103. For example, decreasing the gap along the first lateral direction X between the second subsections 102-1 to 102-3 and the third subsections 103-1, 103-2 may lead to a reduced threshold current that causes ignition of the second subsections 102-1 to 102-3, which may be, as explained above, $p^{++}$-regions.

Figure 9:
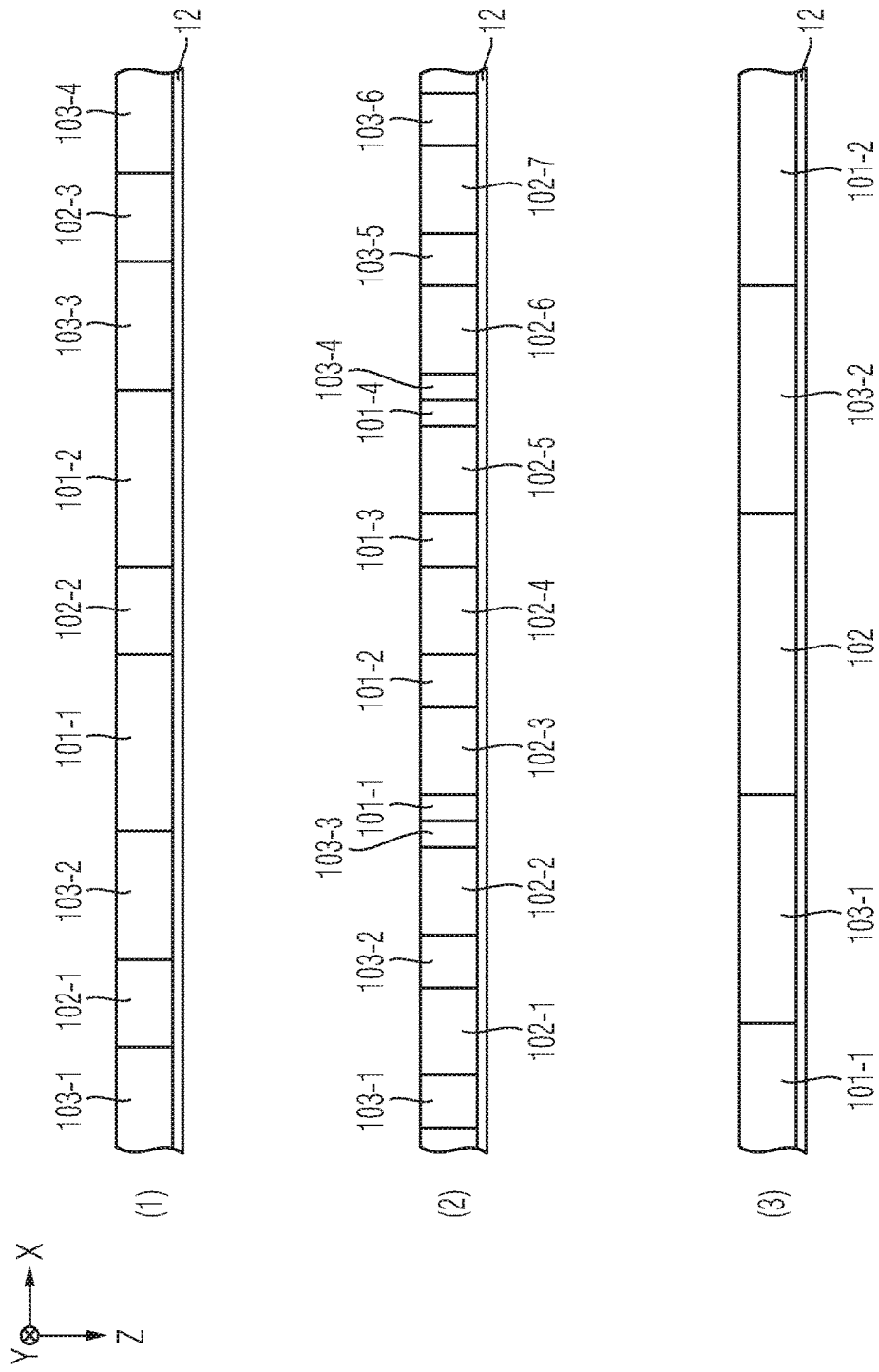

In accordance with variants (1) to (2) of the embodiment of the interface region schematically illustrated in FIG. 9, each of the second subsections 102-1 to 102-7 of the second emitter 102 may be laterally flanked by two first subsections of the first emitter 101 or by two third subsections of the third emitter 103. Thus, in accordance with the embodiment of FIG. 9, each active cell of the transistor 1 may has a first emitter 101 having a plurality of first subsections 101-1 to 101-4 arranged separately from each other and each being connected to the second load terminal 12, a second emitter 102 comprising a plurality of second subsections 102-1 to 102-7 arranged separately from each other, each second subsection 102-1 to 102-7 being electrically connected to the second load terminal 12, and a third emitter 103 having a plurality of third subsections 103-1 to 103-6 arranged separately from each other and each third subsection 103-1 to 103-6 being electrically connected to the second load terminal 12. All of the aforementioned emitter subsections may has the same total extension along the vertical direction Z.

Regarding now variant (3) of the embodiment of the interface region schematically illustrated in FIG. 9, each of the emitters 101, 102 and 103 may be arranged in electrical contact with the second load terminal 12. Further, the third emitter 103 may be arranged so as to isolate the second emitter 102 from the first emitter 101, e.g., along the first lateral direction X. Thus, in an embodiment, the second emitter 102 is not arranged in contact with the first emitter; e.g., no pn-junction is formed by means of a transition between these emitters 101 and 102. Thus, for example, the second emitter 102, e.g., a $p^+$ emitter, e.g., having a higher dopant concentration as the third emitter 103, e.g., a p emitter, may be isolated from the first emitter 101, e.g., an n-emitter, and, at the same time, each of the first emitter 101, the second emitter 102 and the third emitter 103 may be arranged in electrical contact with the second load terminal 12. Further, it shall be understood that in accordance with variant (3), the second emitter 102 and/or the third emitter 103 could be divided into respective subsections 102-1 to 102-$n$/103-1 to 103-$n$, while maintaining said isolation between the second emitter 102 and the first emitter 101 by means of the third emitter 103. In addition, such constellation may be present in each active cell of the active region of the transistor 1.

Figure 10:
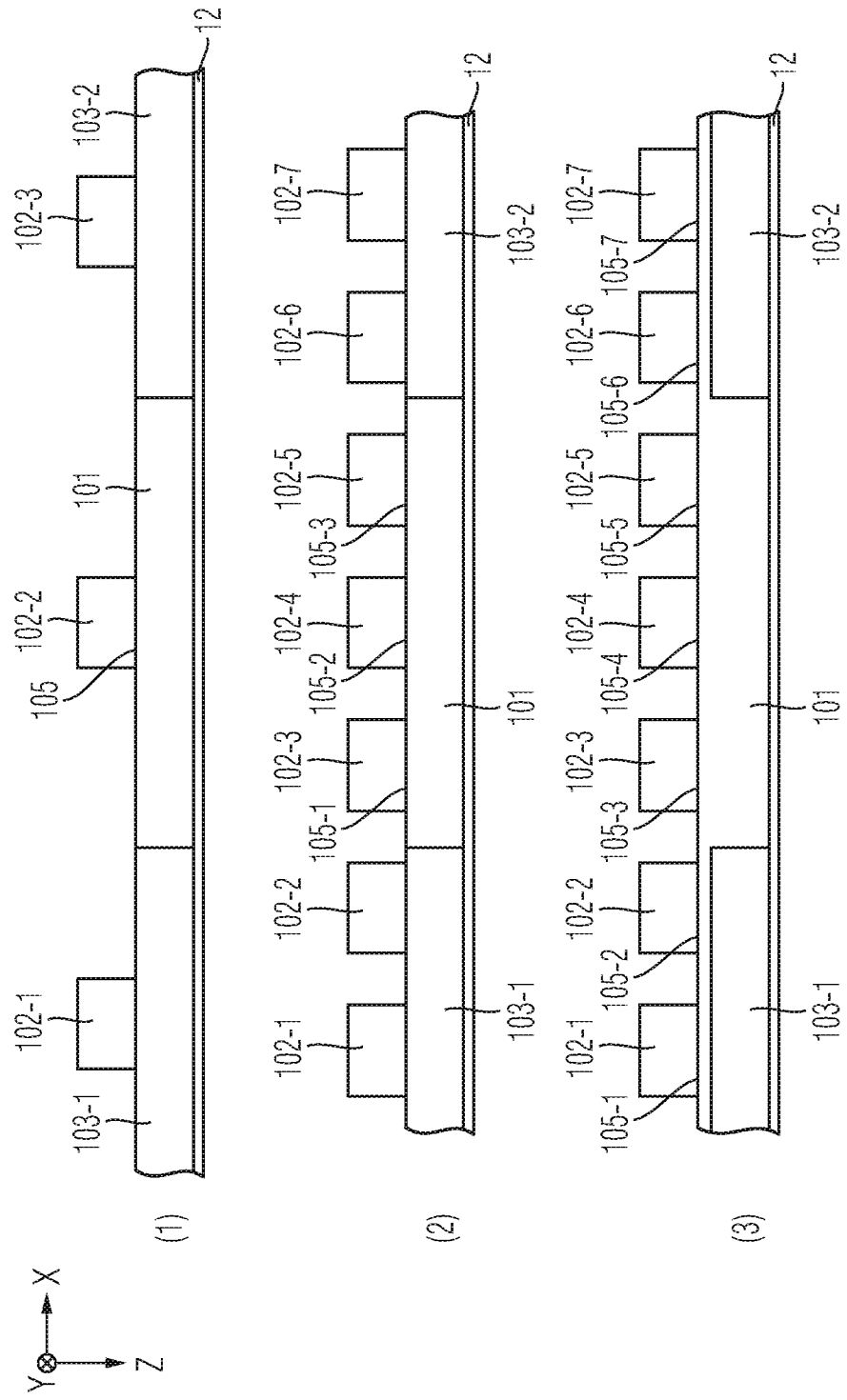

In accordance with variants (1) to (3) of the embodiment of the interface region schematically illustrated in FIG. 10, second subsections 102-1 to 102-7 of the second emitter 102 may be isolated from the second load terminal 12 by means of each of the first emitter 101 and the second emitter 103. For example, in variants (1) to (2), at least some the second subsections 102-1 to 102-7 may be in contact with the third emitter 103. Further, in variants (1) to (3), at least some of the subsections 102-1 to 102-7 of the second emitter 102 may be in contact with the first emitter 101, thereby forming the pn-junction 105 or, respectively, the pn-junctions 105-1 to 105-7 (cf. variant (2) and (3)). What has been stated above with respect to the pn-junction 105 of the embodiment schematically illustrated in FIG. 1 may equally apply to each of the pn-junctions 105, and 105-1 to 105-7 schematically illustrated in FIG. 10. In variants (1) to (3) of the embodiment of the interface region schematically illustrated in FIG. 10, second subsections of the second emitter 102 may also be arranged within the path along the vertical direction Z from the first load terminal 11 to the second load terminal 12 that crosses the third emitter 103 constituted by the third subsections 103-1 and 103-2. In other words, the second emitter 102 (or, respectively, its second subsections) and the third emitter 103 (or, respectively, its third subsections) may has a common lateral extension range along the first lateral direction X.

Figure 11:
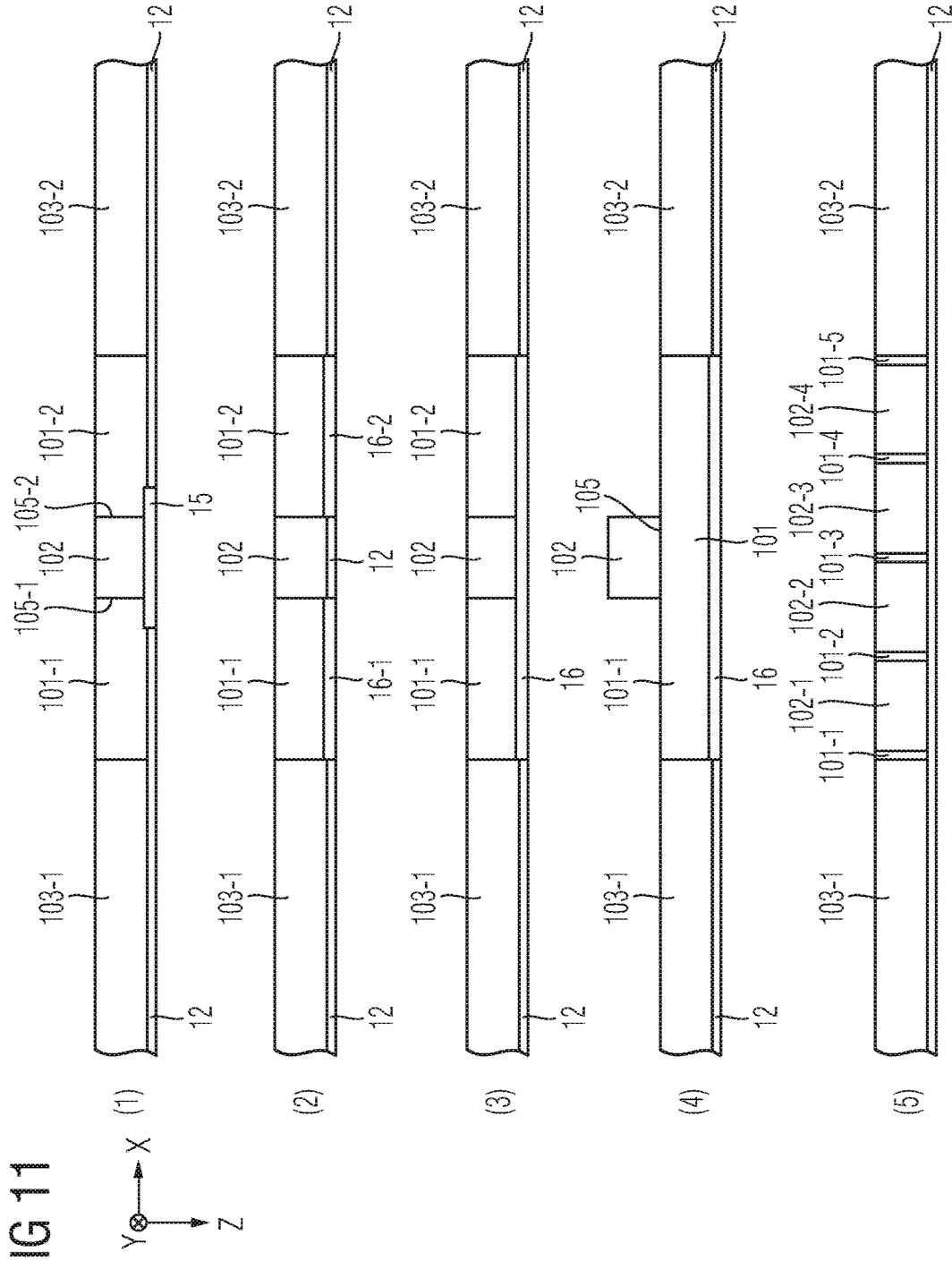

FIG. 11 schematically illustrates further variants (1) to (5) of an exemplary embodiment of the interface region of the transistor 1. For example, in variant 1, the interface region comprises an insulator 15 that electrically insulates the second emitter 102 from the second load terminal 12. Thus, the two pn-junctions 105-1 and 105-2 formed by a transition along the first lateral direction X between the first emitter 101 having the two first subsections 101-1 and 101-2 and the second emitter 102 are electrically insulated from the second load terminal 12. In accordance with this variant (1), each of the first emitter 101 and the third emitter 103 remains electrically connected to the second load terminal 12.

In variant (2), a transition along the vertical direction Z between the first subsections 101-1 and 101-2 of the first emitter 101 to the second load terminal 12 forms a respective Schottky contact 16-1 and 16-2. In this variant, the second emitter 102 may be electrically connected to the second load terminal 12.

In accordance with variant (3), the transition between each of the first emitter 101 having the first emitter subsections 101-1 and 101-2 and the second emitter 102 along the vertical direction Z to the second load terminal 12 constitutes a contiguous Schottky contact 16. Thus, a Schottky barrier may be formed between each of the first emitter 101 and the second emitter 102 and the second load terminal 12, while the third emitter 103 is electrically connected to the second load terminal 12.

In accordance with variant (4), the Schottky contact 16 is only provided between the first emitter 101 and the second load terminal 12, wherein the second emitter 102 is isolated from the second load terminal 12 by means of the first emitter 101.

For example, the structures having said Schottky contact 16 or, respectively, said Schottky contacts 16-1 and 16-2 may be employed for forming a Reverse Blocking IGBT (RB-IGBT).

In accordance with variant (5), the first emitter 101 may comprise a plurality of first subsections 101-1 to 101-5, each of the first subsections 101-1 to 101-5 having the shape of a respective thin fin having a total extension along the lateral direction X that is within the range of 20 nm to 1 µm. Due to this small lateral extension, the electric field may be shielded by lateral components in this area and the transistor 1 may be configured to provide for a reverse blocking capability. Each of the first subsections 101-1 to 101-5 may be laterally neighbored by one or more of the second subsections 102-1 to 102-4 and/or by one of the third subsections 103-1 and 103-2 of the third emitter 103.

Figure 12:
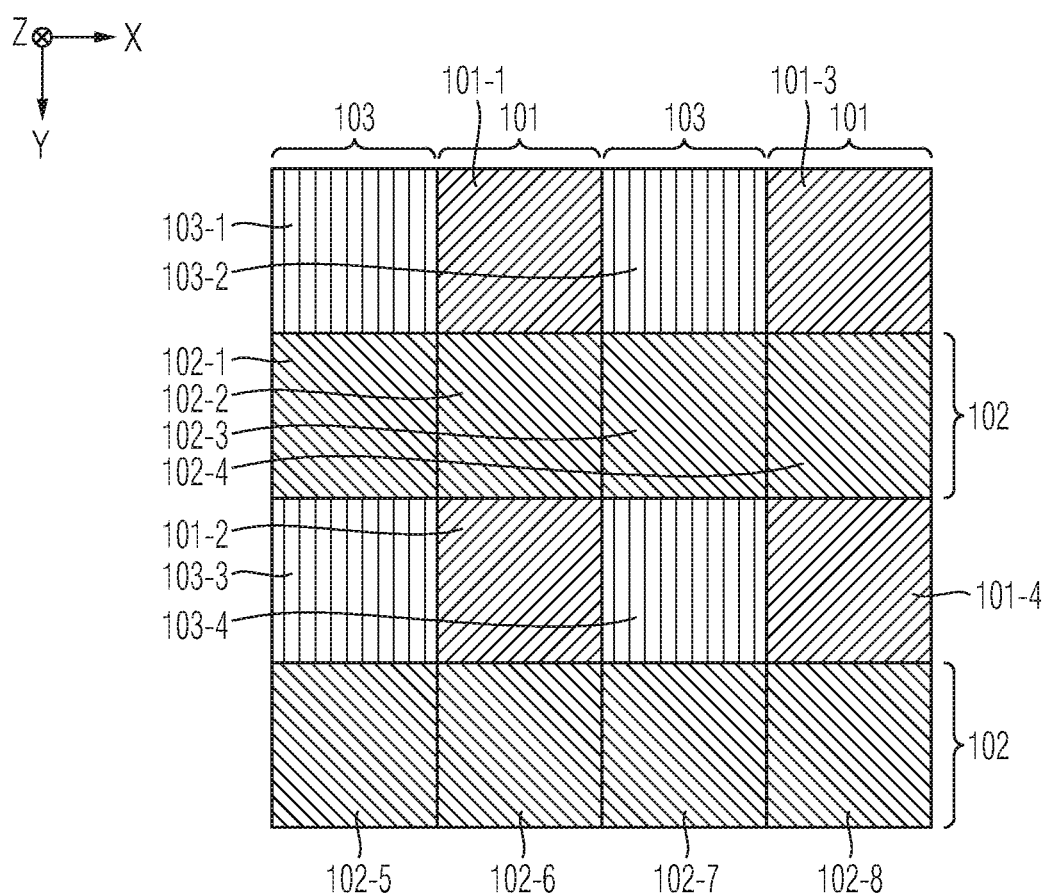
FIGS. 12-13 each schematically illustrate a section of a horizontal projection of an emitter arrangement of a power semiconductor transistor in accordance with one or more embodiments.
Figure 13:
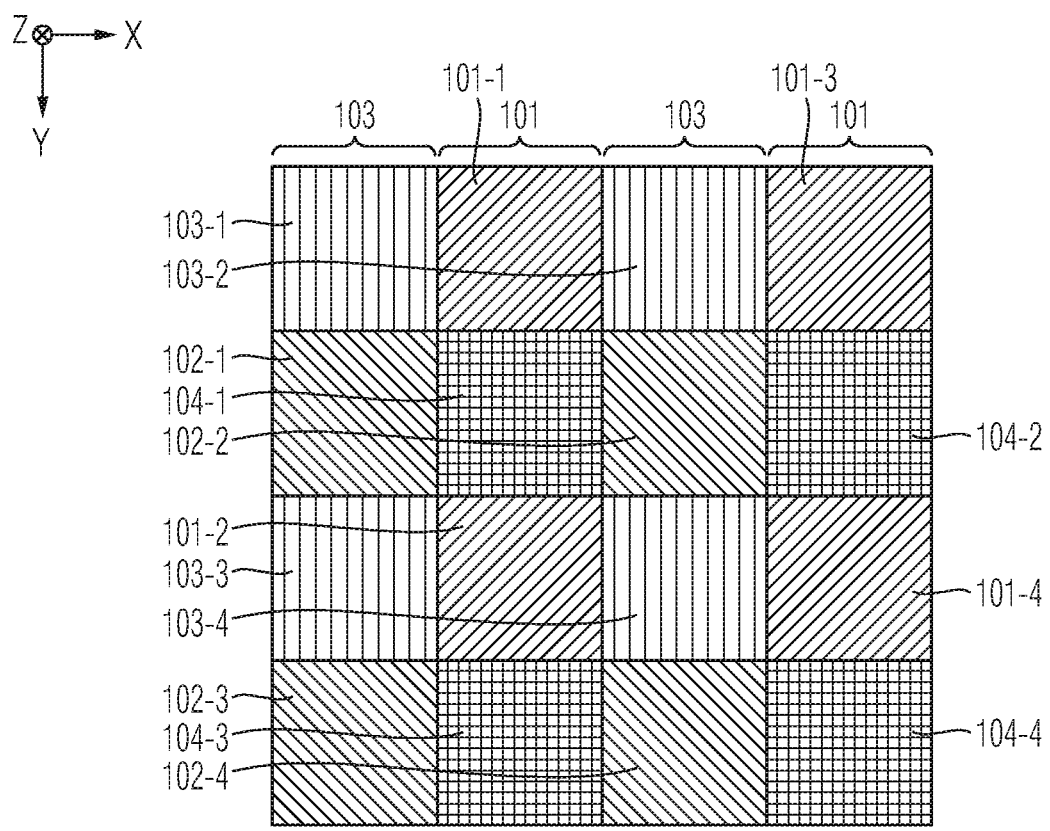

Each of FIG. 12 and FIG. 13 schematically illustrates a section of a horizontal projection of the interface region of the transistor 1 in accordance with some embodiments. For example, said projection may be in parallel to a plane defined by the first lateral direction X and the second lateral direction Y being perpendicular to each of the first lateral direction X and the vertical direction Z. In accordance with the embodiments schematically illustrated in each of FIG. 12 and FIG. 13, the first emitter 101 may has a stripe-like structure and the second emitter 102 may also has a stripe-like structure that is arranged substantially perpendicular to the stripe-like structure of the first emitter 101. Also, the third emitter 103 may has a stripe-like structure arranged substantially in parallel and adjacent to the stripe-like structure of the first emitter 101. For example, the stripe-like structure of the second emitter 102 may be arranged on top of and in contact with each of the stripe-like structure of the first emitter 101 and the stripe-like structure of the second emitter 103, as schematically illustrated in FIG. 12. Thus, the stripe-like structure of the second emitter 102 may be isolated from the second load terminal 12 by means of the stripe-like structures of the first emitter 101 and the third emitter 103. For example, the embodiment of the interface regions schematically illustrated in FIG. 12 corresponds to variant (2) of the embodiment of the interface region schematically illustrated in FIG. 10.

In accordance with the embodiment schematically illustrated in FIG. 13, the set-up of the first emitter 101 and the third emitter 103 is unchanged as compared to the embodiment of FIG. 12, wherein the stripe-like structure of the second emitter 102 is interrupted by one or more interrupt regions 104-1 to 104-4, which may be regions of either the first or the second conductivity type. For example, in case of an n-doping, the emitter efficiency in the reverse conducting mode can be reduced due to a lower doping level of the one or more interrupt regions 104-1 to 104-4 or due to limiting the current flow to the first emitter 101 caused by an non-ohmic contact in the one or more interrupt regions 104-1 to 104-4. The reduced emitter efficiency may result in lower reverse recovery losses. In case of a p-doping in the one or more interrupt regions 104-1 to 104-4, additional regions for hole injection during forward operation are provided, in accordance with an embodiment.

If not stated otherwise, the first emitter 101 (or, respectively, each of its first subsections) may have a dopant concentration within the range of 2e16 cm$^{-3}$ to 1e22 cm$^{-3}$. Further, the third emitter 103 (or, respectively, each of its third subsections) may have a dopant concentration within the range of 1e15 cm$^{-3}$ to 1e18 cm$^{-3}$ and the second emitter 102 (or, respectively, each of its second subsections) may have a dopant concentration within the range of 1e17 cm$^{-3}$ to 1e22 cm$^{-3}$.

If not stated otherwise, a lateral extension of the second emitter 102 along the first lateral direction X may be smaller than 75% of a lateral extension of the first emitter 101 in the first lateral direction X, and also smaller than 75% of a lateral extension of the third emitter 103 in the first lateral direction X. As explained above, the lateral extension of the second emitter 102 may be even significantly smaller than said 75%, e.g., smaller than 50% or smaller than 30% of the lateral extension of the third emitter. For example, the lateral extension of the second emitter 102 in the first lateral direction X is within the range of 5 to 200 µm, within the range of 7 to 120 µm, or within the range of 8 to 80 µm or within the range of 10 to 20 µm. Further, the dopant concentration of the second emitter 102 may be at least ten times greater than the dopant concentration of the third emitter 103. For example, the lateral extension in the first lateral direction X of the second emitter 102 may be chosen in dependence of at least one of the nominal load current and the blocking voltage of the power semiconductor device 1. For example, if the power semiconductor device 1 has a blocking voltage of 1200 V, the lateral extension of the second emitter 102 in the first lateral direction X is within the range of 10 to 20 µm. If the power semiconductor device 1 has a blocking voltage greater than 1200 V, for example of 6500 V, the lateral extension of the second emitter 102 in the first lateral direction X can be greater. Thus, in an embodiment, the lateral extension of the second emitter 102 in the first lateral direction X can be proportional to the blocking voltage of the power semiconductor device 1.

In accordance with one or more embodiments describe above, a lateral extension of the second emitter 102 along a first lateral direction X is smaller than 75% of a lateral extension of the first emitter 101 in the first lateral direction X, and also smaller than 75% of a lateral extension of the third emitter 103 in the first lateral direction X.

In accordance with one or more embodiments describe above, the dopant concentration of the first emitter 101 is within the range of 2e16 cm–3 to 1e22 cm–3.

In accordance with one or more embodiments describe above, the dopant concentration of the second emitter 102 is within the range of 2e17 cm–3 to 1e22 cm–3.

In accordance with one or more embodiments describe above, a transition between the first emitter 101 and the second load terminal 12 comprises a Schottky contact 16.

In accordance with one or more embodiments describe above, the total extension along a first lateral direction X of the second emitter 102 amounts to less than 75% of the total extension along the first lateral direction X of the first emitter 101.

In accordance with one or more embodiments describe above, the second emitter 102 is configured to inject the minority charge carriers into the drift region 100 only if a load current between the first load terminal 11 and the second load terminal 12 is greater than a nominal value.

In accordance with one or more embodiments, a backside emitter structure of a power semiconductor transistor is presented that allows for a bipolar amplification during an overload state that is increased as compared to a bipolar amplification during a nominal state, thereby offering good short circuit robustness and still low switching losses during nominal operation.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to power semiconductor transistors were explained. For example, these semiconductor transistors are based on silicon (Si). Accordingly, a monocrystalline semiconductor region or layer, e.g., the semiconductor regions 10, 100, 101, 101-1, 101-2, 101-3, , . . . , 102, 102-1, 102-2, 102-3, . . . , 103, 103-1, 103-23, 103-3, . . . , 107, 108-1, 108-2, 108-3, 109-1, 109-2, 109-3 and 109-4 of exemplary embodiments, can be a monocrystalline Si-region or Si-layer. In other embodiments, polycrystalline or amorphous silicon may be employed.

It should, however, be understood that the semiconductor regions 10, 100, 101, 101-1, 101-2, 101-3, . . . , 102, 102-1, 102-2, 102-3, . . . , 103, 103-1, 103-23, 103-3, . . . , 107, 108-1, 108-2, 108-3, 109-1, 109-2, 109-3 and 109-4 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (Si$_x$C1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor transistor comprising a first load terminal, a second load terminal and a semiconductor body coupled to the first load terminal and the second load terminal, wherein the semiconductor body comprises:
    a drift region having dopants of a first conductivity type;
    a transistor section configured to conduct a forward load current, the transistor section having a control head that couples the first load terminal to a first side of the drift region; and
    a diode section configured to conduct a reverse load current, wherein the diode section has a diode port that couples the second load terminal to a second side of the drift region,
wherein the diode port comprises:
    a first emitter having dopants of the first conductivity type and being configured to inject majority charge carriers into the drift region, the first emitter being electrically connected to the second load terminal; and
    a second emitter having dopants of a second conductivity type and being configured to inject minority charge carriers into the drift region, wherein the first emitter is arranged in contact with the second emitter, and wherein a pn-junction formed by a transition between the first emitter and the second emitter has a breakdown voltage of less than 10 V, wherein each of the first emitter and the second emitter have a dopant concentration of at least 5e18 cm$^{-3}$.

2. The power semiconductor transistor of claim 1, wherein the pn-junction is isolated from the second load terminal.

3. The power semiconductor transistor of claim 1, wherein the first emitter and the second emitter are configured to be operated as a Zener diode.

4. The power semiconductor transistor of claim 1, wherein the diode port forms a part of a cathode of the diode section.

5. The power semiconductor transistor of claim 1, wherein the transistor section further comprises a drain port that couples the second load terminal to the second side of the drift region, wherein the drain port includes a third emitter arranged separately from the second emitter and electrically connected to the second load terminal, the third emitter having dopants of the second conductivity type and being configured to inject minority charge carriers into the drift region.

6. The power semiconductor transistor of claim 5, wherein the third emitter is arranged laterally adjacent to the first emitter, the first emitter isolating the second emitter from each of the second load terminal and the third emitter.

7. The power semiconductor transistor of claim 5, wherein a total extension along a first lateral direction of the second emitter amounts to less than 75% of a total extension along the first lateral direction of the third emitter.

8. The power semiconductor transistor of claim 5, wherein the semiconductor body further comprises a field stop region having dopants of the first conductivity type at a greater dopant concentration than the drift region, wherein the field stop region couples each of the first emitter, the second emitter and the third emitter to the drift region.

9. The power semiconductor transistor of claim 1, wherein the power semiconductor transistor comprises an active region configured to conduct each of the forward load current and the reverse load current, and a non-active edge region surrounding the active region, wherein the active region comprises a plurality of active cells, wherein each active cell includes at least one of said transistor section and at least one of said diode section.

10. A power semiconductor transistor comprising a first load terminal, a second load terminal and a semiconductor body coupled to the first load terminal and the second load terminal, the semiconductor body comprising:
    a drift region having dopants of a first conductivity type;
    a plurality of active cells configured to implement both a transistor operation for conducting a forward load current and a diode operation for conducting a reverse load current, each active cell comprising a control head and an interface region, the control head coupling the first load terminal to a first side of the drift region, and the interface region coupling the second load terminal to a second side of the drift region,
wherein the interface region comprises:
    a first emitter having dopants of the first conductivity type and being configured to inject majority charge carriers into the drift region for diode operation;
    a second emitter having dopants of a second conductivity type and being configured to inject minority charge carriers into the drift region; and
    a third emitter arranged separately from the second emitter and electrically connected to the second load terminal, the third emitter having dopants of the second conductivity type and being configured to inject minority charge carriers into the drift region for transistor operation, wherein a dopant concentration of the second emitter is greater than a dopant concentration of the third emitter, and wherein each of the first emitter, the second emitter and the third emitter is electrically connected to the second load terminal;
wherein the semiconductor body further comprises a field stop region having dopants of the first conductivity type at a greater dopant concentration than the drift region, wherein the field stop region couples each of the first emitter, the second emitter and the third emitter to the drift region.

11. The power semiconductor transistor of claim 10, wherein the first emitter isolates the second emitter from the third emitter.

12. The power semiconductor transistor of claim 10, wherein the second emitter is arranged in contact with the first emitter, and wherein a pn-junction formed by a transition between the first emitter and the second emitter is isolated from the second load terminal.

13. The power semiconductor transistor of claim 10, wherein the first emitter is in contact with each of the second emitter and the third emitter.

14. The power semiconductor transistor of claim 10, wherein the power semiconductor transistor comprises an active region configured to conduct each of the forward load current and the reverse load current, and a non-active edge region surrounding the active region, wherein the active region comprises the plurality of active cells.

15. The power semiconductor transistor of claim 10, wherein a lateral extension of the second emitter along a first lateral direction is smaller than 75% of a lateral extension of the first emitter in the first lateral direction, and also smaller than 75% of a lateral extension of the third emitter in the first lateral direction.

16. A power semiconductor transistor comprising a first load terminal, a second load terminal and a semiconductor body coupled to the first load terminal and the second load terminal, the semiconductor body comprising:
    a drift region having dopants of a first conductivity type;
    a plurality of active cells configured to implement both a transistor operation for conducting a forward load current and a diode operation for conducting a reverse load current, each active cell comprising a control head and an interface region, the control head coupling the first load terminal to a first side of the drift region, and the interface region coupling the second load terminal to a second side of the drift region,
wherein the interface region comprises:
    a first emitter having dopants of the first conductivity type and being configured to inject majority charge carriers into the drift region for diode operation;
    a second emitter having dopants of a second conductivity type and being configured to inject minority charge carriers into the drift region; and
    a third emitter arranged separately from the second emitter, the third emitter having dopants of the second conductivity type and being configured to inject minority charge carriers into the drift region for transistor operation, wherein each of the first emitter, the second emitter and the third emitter is electrically connected to the second load terminal, and wherein a dopant concentration of the second emitter is greater than a dopant concentration of the third emitter;
wherein the third emitter isolates the second emitter from the first emitter.

17. The power semiconductor transistor of claim 16, wherein the semiconductor body further comprises a field stop region having dopants of the first conductivity type at a greater dopant concentration than the drift region, wherein the field stop region couples each of the first emitter. the second emitter and the third emitter to the drift region.

18. The power semiconductor transistor of claim 16, wherein the power semiconductor comprises an active region configured to conduct each of the forward load current and the reverse load current, and a non-active edge region surrounding the active region, wherein the active region comprises the plurality of active cells.

19. The power semiconductor transistor of claim 16, wherein a lateral extension of the second emitter along a first lateral direction is smaller than 75% of a lateral extension of the first emitter in the first lateral direction, and also smaller than 75% of a lateral extension of the third emitter in the first lateral direction.

* * * * *